United States Patent
Yoshizawa

(10) Patent No.: US 7,560,933 B2
(45) Date of Patent: Jul. 14, 2009

(54) MRI APPARATUS AND RF PULSE GENERATING CIRCUIT

(75) Inventor: Nobuhiro Yoshizawa, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 12/103,557

(22) Filed: Apr. 15, 2008

(65) Prior Publication Data

US 2008/0258732 A1    Oct. 23, 2008

(30) Foreign Application Priority Data

Apr. 18, 2007    (JP)    ............... 2007-109062

(51) Int. Cl.
*G01V 3/00*    (2006.01)
(52) U.S. Cl. .................................. 324/322; 324/318
(58) Field of Classification Search ......... 324/300–322; 600/407–445; 375/239; 370/205; 332/109
See application file for complete search history.

(56) References Cited

U.S. PATENT DOCUMENTS

| | | | |
|---|---|---|---|
| 4,472,683 A | | 9/1984 | Sekihara et al. |
| 4,855,961 A | | 8/1989 | Jaffe et al. |
| 4,879,514 A | * | 11/1989 | Mehlkopf et al. ........... 324/309 |
| 5,051,700 A | | 9/1991 | Fox |
| 5,072,183 A | * | 12/1991 | McKinnon et al. .......... 324/314 |
| 5,189,372 A | | 2/1993 | Igarashi et al. |
| 5,529,068 A | * | 6/1996 | Hoenninger et al. ........ 600/413 |
| 6,456,074 B1 | | 9/2002 | Minas |
| 6,564,900 B1 | | 5/2003 | Dean et al. |
| 6,633,162 B2 | * | 10/2003 | Zhang et al. ................. 324/322 |
| 6,866,634 B2 | | 3/2005 | Asafusa |
| 7,251,520 B2 | | 7/2007 | Shankaranarayanan et al. |
| 7,286,599 B1 | * | 10/2007 | Cheah ........................ 375/238 |
| 2008/0228062 A1 | * | 9/2008 | Zwirn et al. ................. 600/407 |

FOREIGN PATENT DOCUMENTS

JP    05-007570    1/1993

* cited by examiner

*Primary Examiner*—Brij B Shrivastav
(74) *Attorney, Agent, or Firm*—Armstrong Teasdale LLP

(57) ABSTRACT

An MRI apparatus includes: an RF coil to which analog RF pulse signals are applied; an RF pulse generating circuit which generates said analog RF pulse signals; and a magnetic resonance signal receiving circuit which receives analog magnetic resonance signals and converts these signals into baseband digital magnetic resonance signals, said RF pulse generating circuit comprising: a carrier signal generator which generates a digital carrier signal having a predetermined number of bits; a digital modulator which modulates said digital carrier signal with a digital envelope signal, thus generating digital RF pulse signals; a digital-analog converter which converts said digital RF pulse signals into the analog RF pulse signals; and an inversion unit which generates a digital inverted carrier signal having a two's complement relationship with said digital carrier signal and sends the digital inverted carrier signal to said magnetic resonance signal receiving circuit, said magnetic resonance signal receiving circuit comprising: an analog-digital converter which converts the analog magnetic resonance signals into digital magnetic resonance signals having a predetermined number of bits; and a digital demodulator which demodulates said digital magnetic resonance signals with said digital inverted carrier signal, thus converting these signals into the baseband digital magnetic resonance signals.

20 Claims, 8 Drawing Sheets

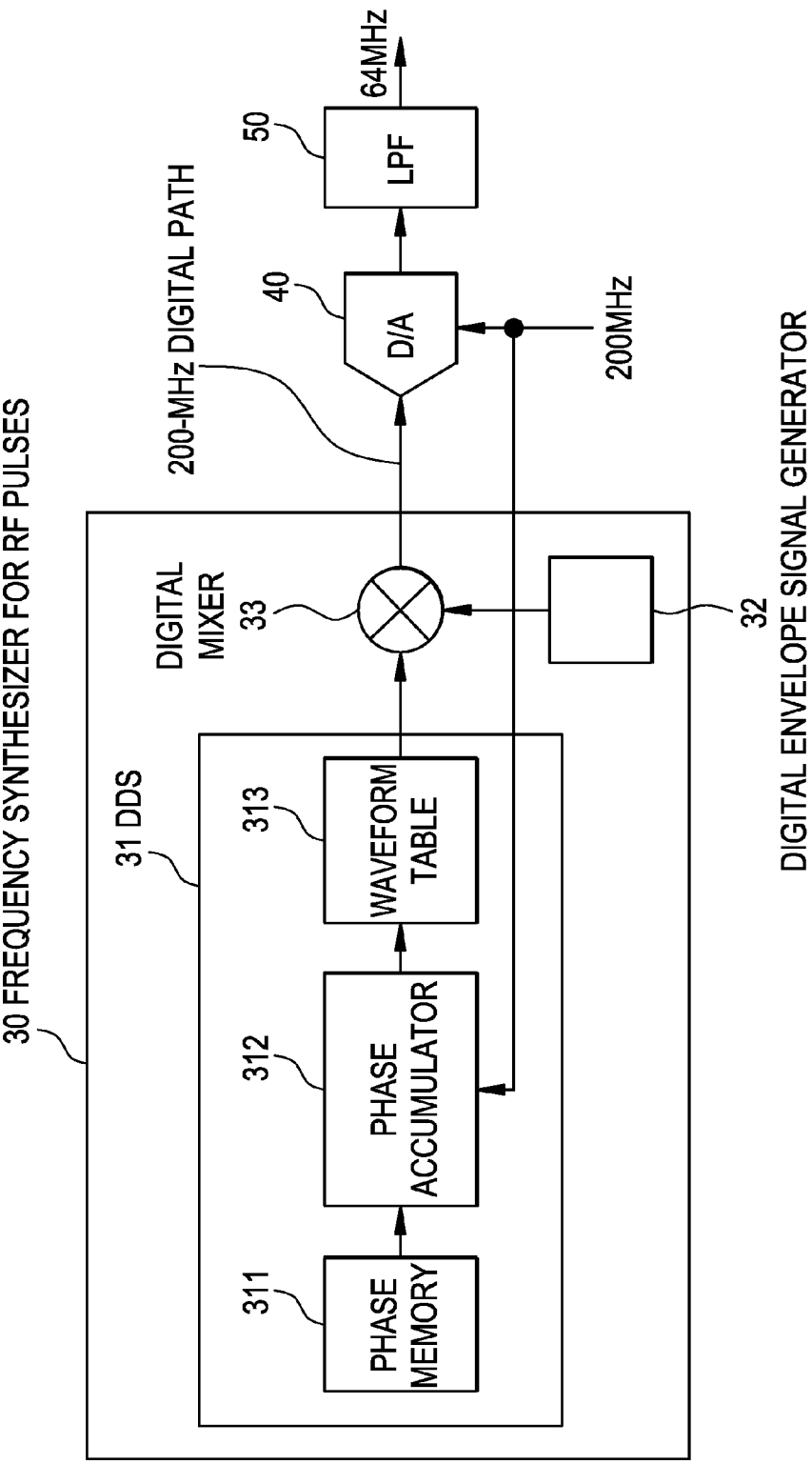

DDS31
t0 0111 0000 0000
t1 0101 0000 0000
t2 1000 0000 0100
t3 0110 0010 0000
t4 0101 0010 0000

– 1 –

MRI APPARATUS AND RF PULSE GENERATING CIRCUIT

CROSS REFERENCE TO RELATED APPLICATIONS

This application claims the benefit of Japanese Patent Application No. 2007-109062 filed Apr. 18, 2007.

BACKGROUND OF THE INVENTION

The subject matter described herein relates to an MRI apparatus and an RF pulse generating circuits. More specifically, the subject matter described herein relates to an MRI apparatus that can reduce noise introduced when generating RF pulses and an RF pulse generating circuit used to generate RF pulses in the MRI apparatus.

A high precision is required for RF pulse frequency. Therefore, a direct digital synthesizer (hereinafter referred to as a DDS) is used to generate RF pulses in a digital signal form (hereinafter referred to as digital RF pulse signals) and these pulses are converted into RF pulses in an analog signal form (hereinafter referred to as analog RF pulse signals) through a digital-analog converter (hereinafter referred to as a D/A converter). Hereinafter, "RF pulses" mean those that are transmitted from an RF coil.

When RF pulses are transmitted from an RF coil to which analog RF pulse signals have been applied, magnetic resonance signals are generated from a subject positioned in a magnetic field. The magnetic resonance signals are received by the RF coil and converted into magnetic resonance signals in a digital form (hereinafter referred to as digital magnetic resonance signals) through an analog-digital converter (hereinafter referred to as an A/D converter). Hereinafter, the magnetic resonance signals that have been received by the RF coil, but have not yet been converted into digital magnetic resonance signals by the A/D converter are referred to as analog magnetic resonance signals. "Magnetic resonance signals" plainly mentioned herein mean those generated from the subject and received by the RF coil.

When noise is superimposed on analog magnetic resonance signals, the noise appears as an artifact in an image reconstructed by the MRI apparatus and degrades the image quality. However, the receiving sensitivity of the RF coil must be as high as possible in order to receive faint magnetic resonance signals. This results in that noise is easily superimposed on analog magnetic resonance signals. Hence, to reduce noise impact, various means are taken. For example, a method for preventing image quality degradation resulting from superimposing of noise induced by a clock signal in a digital circuit on analog magnetic resonance signals is proposed (see, for example, Japanese Unexamined Patent Publication No. Hei 5(1993)-7570).

However, if it is possible to prevent noise that may be superimposed on analog magnetic resonance signals, this is most desirable.

Since RF pulses are transmitted to excite magnetic resonance signals, the frequency of the RF pulses is equal to the frequency of the magnetic resonance signals. Consequently, noise that is superimposed on analog magnetic resonance signals may be generated from a wiring path through which analog RF pulse signals are sent to the RF coil. To prevent this, measures for preventing noise generation, such as impedance matching, are taken for the wiring path for sending analog RF pulse signals after being converted by the D/A converter.

However, weak noise that is superimposed on analog magnetic resonance signals is also generated from a digital bus through which digital RF pulse signals are sent to the D/A converter.

SUMMARY OF THE INVENTION

There is a need for an MRI apparatus that can reduce noise that is superimposed on analog magnetic resonance signals from digital RF pulse signals transmitted on a digital bus, and also an RF pulse generating circuit used to generate RF pulses in the MRI apparatus.

An MRI apparatus of the invention comprises: an RF coil to which analog RF pulse signals are applied; an RF pulse generating circuit which generates the analog RF pulse signals; and a magnetic resonance signal receiving circuit which receives analog magnetic resonance signals and converts these signals into baseband digital magnetic resonance signals, the RF pulse generating circuit comprising: a carrier signal generator which generates a digital carrier signal having a predetermined number of bits; a digital modulator which modules the digital carrier signal with a digital envelope signal, thus generating digital RF pulse signals; a digital-analog converter which converts the digital RF pulse signals into analog RF pulse signals; and an inversion unit which generates a digital inverted carrier signal having a two's complement relationship with the digital carrier signal and sends the digital inverted carrier signal to the magnetic resonance signal receiving circuit, the magnetic resonance signal receiving circuit comprising: an analog-digital converter which converts the analog magnetic resonance signals into digital magnetic resonance signals having a predetermined number of bits; and a digital demodulator which demodulates the digital magnetic resonance signals with the digital inverted carrier signal, thus converting these signals into the baseband digital magnetic resonance signals.

In the MRI apparatus of the invention, preferably, the carrier signal generator comprises a first phase memory which stores a phase increment, a first phase accumulator in which an initial value of a first phase is set at initialization and a first accumulated phase is calculated by adding the phase increment for every clock period, and a first waveform table which stores the digital carrier signal and, when the first accumulated phase is input thereto, outputs the digital carrier signal corresponding to the first accumulated phase.

In the MRI apparatus of the invention, preferably, the inversion unit generates the digital inverted carrier signal by transforming the digital carrier signal generated by the carrier signal generator into two's complement form.

In the MRI apparatus of the invention, preferably, the inversion unit comprises a second phase memory which stores the phase increment, a second phase accumulator in which an initial value of a second phase is set at initialization and a second accumulated phase is calculated by adding the phase increment for every clock period, and a second waveform table which stores the digital inverted carrier signal and, when the second accumulated phase is input thereto, outputs the digital inverted carrier signal corresponding to the second accumulated phase, and an arbitrary phase difference between the digital carrier signal and the digital inverted carrier signal can be set by adjusting the initial value of the first phase and the initial value of the second phase.

In the MRI apparatus of the invention, preferably, the digital modulator is a digital mixer.

In the MRI apparatus of the invention, preferably, the digital demodulator is a digital mixer.

Preferably, the MRI apparatus of the invention further comprises a low-pass filter which removes higher harmonic components included in the analog RF pulse signals.

In the MRI apparatus of the invention, preferably, analog RF pulse signals from which the higher harmonic components have been removed are amplified and applied to the RF coil.

In the MRI apparatus of the invention, preferably, the initial value of the first phase and the initial value of the second phase are set to minimize noise that is superimposed on the analog magnetic resonance signals, when a subject does not exist in a bore.

For use in an MRI apparatus including a magnetic resonance signal receiving circuit which demodulates digital magnetic resonance signals having a predetermined number of bits with a digital inverted carrier signal, thus converting these signals into baseband digital magnetic resonance signals, an RF pulse generating circuit of the invention comprises: a carrier signal generator which generates a digital carrier signal having a predetermined number of bits; a digital modulator which modulates the digital carrier signal with a digital envelope signal, thus generating digital RF pulse signals; a digital-analog converter which converts the digital RF pulse signals into analog RF pulse signals; and an inversion unit which generates a digital inverted carrier signal having a two's complement relationship with the digital carrier signal and sends the digital inverted carrier signal to the magnetic resonance signal receiving circuit.

In the RF pulse generating circuit of the invention, preferably, the carrier signal generator comprises a first phase memory which stores a phase increment, a first phase accumulator in which an initial value of a first phase is set at initialization and a first accumulated phase is calculated by adding the phase increment for every clock period, and a first waveform table which stores the digital carrier signal and, when the first accumulated phase is input thereto, outputs the digital carrier signal corresponding to the first accumulated phase.

In the RF pulse generating circuit of the invention, preferably, the inversion unit generates the digital inverted carrier signal by transforming the digital carrier signal generated by the carrier signal generator into two's complement form.

In the RF pulse generating circuit of the invention, preferably, the inversion unit comprises a second phase memory which stores the phase increment, a second phase accumulator in which an initial value of a second phase is set at initialization and a second accumulated phase is calculated by adding the phase increment for every clock period, and a second waveform table which stores the digital inverted carrier signal and, when the second accumulated phase is input thereto, outputs the digital inverted carrier signal corresponding to the second accumulated phase, and an arbitrary phase difference between the digital carrier signal and the digital inverted carrier signal can be set by adjusting the initial value of the first phase and the initial value of the second phase.

In the RF pulse generating circuit of the invention, preferably, the digital modulator is a digital mixer.

In the RF pulse generating circuit of the invention, preferably, the digital demodulator is a digital mixer.

Preferably, the RF pulse generating circuit of the invention further comprises a low-pass filter which removes higher harmonic components included in the analog RF pulse signals.

Effect of the Invention. As noted above, according to the invention, it is possible to provide an MRI apparatus that can reduce noise that is superimposed on analog magnetic resonance signals from digital RF pulse signals transmitted on a digital bus, and also an RF pulse generating circuit used to generate RF pulses in the MRI apparatus.

Further objects and advantages of the present invention will be apparent from the following description of the preferred embodiments of the invention as illustrated in the accompanying drawings.

BRIEF DESCRIPTION OF THE DRAWINGS

FIG. 2 is a block diagram showing an example of an RF pulse generating circuit.

DETAILED DESCRIPTION OF THE INVENTION

Figure 1:
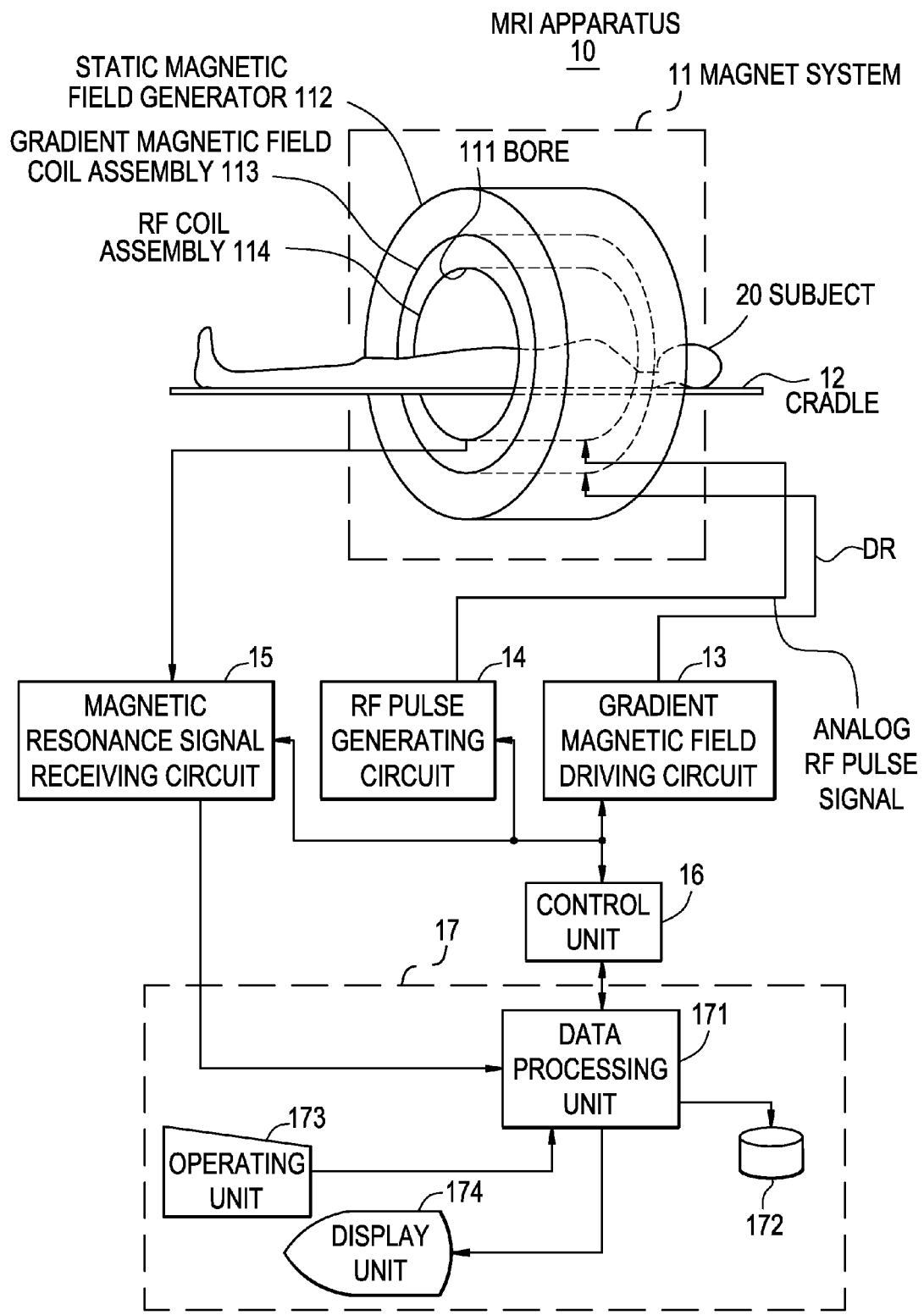
FIG. 1 is a diagram showing an MRI apparatus.

FIG. 1 is a diagram showing an MRI apparatus. The MRI apparatus 10, as shown in FIG. 1, includes a magnet system 11, a cradle 12, a gradient magnetic field driving circuit 13, an RF pulse generating circuit 14, a magnetic resonance signal receiving circuit 15, a control unit 16, and an operator console 17.

The magnet system 11 involves a practically transversely-cylindrical internal space (bore) 111, as shown in FIG. 1, and the cradle 12 on which a subject 20 is laid, supported on a cushion, is moved into the bore 111 by a transport mechanism which is not shown.

In the magnet system 11, around the magnet center of the bore 11 (the scan center position), a static magnetic field generator 112, a gradient magnetic field coil assembly 113, and an RF coil assembly 114 are placed, as shown in FIG. 1.

The static magnetic field generator 112 forms a static magnetic field in the bore 111. The direction of the static magnetic field is, for example, parallel with the axial direction of the body of the subject 20. However, the direction of the static magnetic field may be vertical to the axial direction of the body of the subject 20.

The gradient magnetic field coil assembly 113 generates gradient magnetic fields to slope the intensity of the static magnetic field formed by the static magnetic field generator 112 so that three-dimensional positional information is provided by a magnetic resonance signal which is received by the RF coil assembly 114. There are three types of gradient magnetic fields that are generated by the gradient magnetic field coil assembly 113: gradient magnetic fields for slice selection, gradient magnetic fields for frequency encoding, gradient magnetic fields for phase encoding. To accommodate these three types of gradient magnetic fields, the gradient magnetic field coil assembly 113 comprises three systems of gradient magnetic field coils.

The RF coil assembly 114 transmits RF pulses to excite the spinning of protons inside the body of the subject 20 in the space of the static magnetic field formed by the static magnetic field generator 112, thereby causing the generation of magnetic resonance signals. At the same time, the RF coil assembly 114 receives magnetic resonance signals generated by the subject 20. The RF coil assembly 114 may be constructed to have a transmitting RF coil unit and a receiving RF coil unit separately or constructed such that RF pulse transmission and magnetic resonance signal reception are performed by a same RF coil unit.

The gradient magnetic field driving circuit 13 supplies a drive signal DR to the gradient magnetic field coil assembly 113 to generate gradient magnetic fields, based on a command from the control unit 16. The gradient magnetic field driving circuit 13 comprises three systems of drive circuits, which are not shown, corresponding to the three systems of gradient magnetic field coils of the gradient magnetic field coil assembly 113.

The RF pulse generating circuit 14 includes a frequency synthesizer for RF pulses, as will be described later, and generates analog RF pulse signals, using the frequency synthesizer for RF pulses. The analog RF pulse signals are applied to the RF coil assembly 114 and RF pulses are transmitted from the RF coil assembly 114.

The magnetic resonance signal receiving circuit 15, as will be described later, takes in analog magnetic resonance signals received by the RF coil assembly 114, converts these signals into baseband digital magnetic resonance signals, and outputs the latter signals to a data processing unit 171 in the operator console 17.

The control unit 16 controls the gradient magnetic field driving circuit 13 and the RF pulse generating circuit 14 in accordance with a predetermined pulse sequence to generate the drive signal DR and analog RF pulse signals. Further, the control unit 16 controls the magnetic resonance signal receiving circuit 15.

The operator console 17 includes the data processing unit 171, an image database 172, an operating unit 173, and a display unit 174, as shown in FIG. 1. The data processing unit 171 performs overall control of the MRI apparatus 10, image reconstruction processing, and so on. The control unit 16 is connected to the data processing unit 171 and the data processing unit 171 controls the operation of the control unit 16. Further, the image database 172, the operating unit 173, and the display unit 174 are connected to the data processing unit 171. The image database 172 includes, for example, a recordable/reproducible hard disk device or the like to record reconstructed image data and the like. The operating unit 173 includes a keyboard, a mouse, etc. and the display unit 174 includes a graphic display or the like.

The bore 11 is an example of a bore involved in the invention, the RF coil assembly 114 is an example of an RF coil assembly involved in the invention, the RF pulse generating circuit 14 is an example of an RF pulse generating circuit involved in the invention, and the magnetic resonance signal receiving circuit 15 is an example of a magnetic resonance signal receiving circuit involved in the invention.

FIG. 2 is a block diagram showing an example of the RF pulse generating circuit. The RF pulse generating circuit 14 comprises a frequency synthesizer for RF pulses 30, a D/A converter 40, and a low-pass filter (hereinafter referred to as an LPF) 50. The same reference numbers in FIG. 1 and FIG. 2 denote the same components.

The frequency synthesizer for RF pulses 30 includes a direct digital synthesizer (hereinafter referred to as a DDS) 31, a digital envelope signal generator 32, and a digital mixer 33. The DDS 31 includes a phase memory 311, a phase accumulator 312, and a waveform table 313. In the phase memory 311, a phase increment is stored. The phase accumulator 312 stores an accumulated phase. An initial value of phase is set in the phase accumulator 312 at initialization and an accumulated phase is calculated by adding the phase increment for every clock period. Here, the clock period is a reciprocal of the sampling frequency fs of the D/A converter 40. The accumulated phase is input to the waveform table 313. The waveform table 313 is, for example, formed by a ROM and digital carrier signal values corresponding to accumulated phases are stored therein. An accumulated phase is input into an address of the ROM and a digital carrier signal value stored in that address is output from the ROM. The digital envelope signal generator 32 generates a digital envelope signal. The digital mixer 33 modulates a digital carrier signal with the digital envelope signal and thus generates digital RF pulse signals with a predetermined bandwidth.

Digital RF pulse signals are sent from the frequency synthesizer for RF pulses 30 to the D/A converter 40 and converted into analog RF pulse signals by the D/A converter 40. Because the analog RF pulse signals which are output from the D/A converter 40 involve harmonics, the pulse signals are passed through the LPF 50 by which higher harmonic components are removed. After that, the analog RF pulse signals are amplified by a power amplifier and sent to the RF coil assembly 114.

During the passage of the analog RF pulse signals to the RF coil assembly 114, in order that generation of noise that may be superimposed on analog magnetic resonance signals is suppressed to a maximum extent, measures for preventing noise generation, such as impedance matching, are taken for a wiring path connecting the LPF 50 and the RF coil assembly 114.

The RF pulse frequency is determined depending on the intensity of the static magnetic field. For example, in the MRI apparatus 10 with the static magnetic field intensity of 1.5 T (tesla), the RF pulse frequency is about 64 MHz. The sampling frequency fs of the D/A converter 40 must be equal to or greater than a Nyquist frequency (about 64 MHz×2). In FIG. 2, for example, the sampling frequency fs=200 MHz. At this time, the frequency synthesizer for RF pulses 30 operates at 200 MHz and outputs digital RF pulse signals onto a digital bus at intervals of 5 nsec.

Figures 3A, 3B:
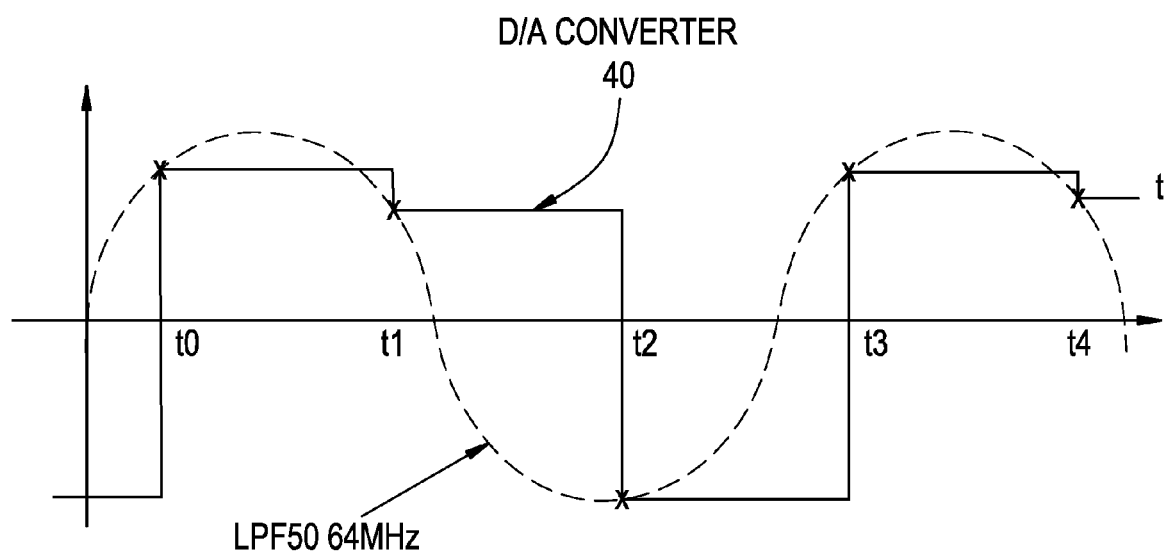
FIGS. 3(a) and 3(b) are graphic representations showing output examples of a DDS, D/A converter, and LPF.

FIGS. 3(*a*) and 3(*b*) are graphic representations showing output examples of the DDS, D/A converter, and LPF. Output of the DDS 31 is, for example, a 12-bit length and represented in a two's complement form. In this case, for example, digital values as shown in FIG. 3(*a*) are output at intervals of 5 nsec. Here, t0 to t4 are time instants with an interval of 5 nsec between them. Although the output of the DDS 31 is modulated by the digital mixer 33 and converted into a digital RF pulse signal with a predetermined bandwidth, FIGS. 3(*a*) and 3(*b*) show examples where a digital RF pulse signal which is a 64-MHz sine wave is output from the frequency synthesizer for RF pulses 30 for simplification purposes. At this time, as shown in FIG. 3(*b*), a signal having a stepwise waveform is output from the D/A converter 40 and an analog waveform signal as a 64-MHz sine wave from which higher harmonic components have been removed is output from the LPF 50.

FIGS. 4(*a*)-4(*d*) are graphic representations showing values assumed by individual bits of a 64-MHz digital sine-wave signal. T denotes one period of the 64-MHz sine wave. The 64-MHz digital sine-wave signal is represented, for example, in a two's complement form and the sine wave assumes a positive peak value=0111 1111 1111 and a negative peak value=1000 0000 0000. At this time, MSB is at a low level when the digital sine-wave signal is positive and at a high level when the digital sine-wave signal is negative. Therefore, MSB is a result of sampling of a rectangular wave changing in a period of T, as shown in FIG. 4(b). A second highest bit (MSB−1) is at a high level when the value of the digital sine-wave signal is equal to or greater than one half of the positive peak or between 0 and one half of the negative peak; otherwise, this bit is at a low level. Therefore, the (MSB−1) bit is a result of sampling of a waveform changing in a period of T, as shown in FIG. 4(c). Likewise, a third highest bit (MSB−2) is a result of sampling of a waveform changing in a period of T, as shown in FIG. 4(d). For example, at a time instant of $t_0$ shown in FIG. 3(a), MSB=0, (MSB−1)=1, and (MSB−2)=1, as shown in FIG. 4(b), FIG. 4(c), and FIG. 4(d), respectively. At a time instant of $t_2$ shown in FIG. 3(a), MSB=1, (MSB−1)=0, and (MSB−2)=0, as shown in FIG. 4(b), FIG. 4(c), and FIG. 4(d), respectively.

Figure 4A:
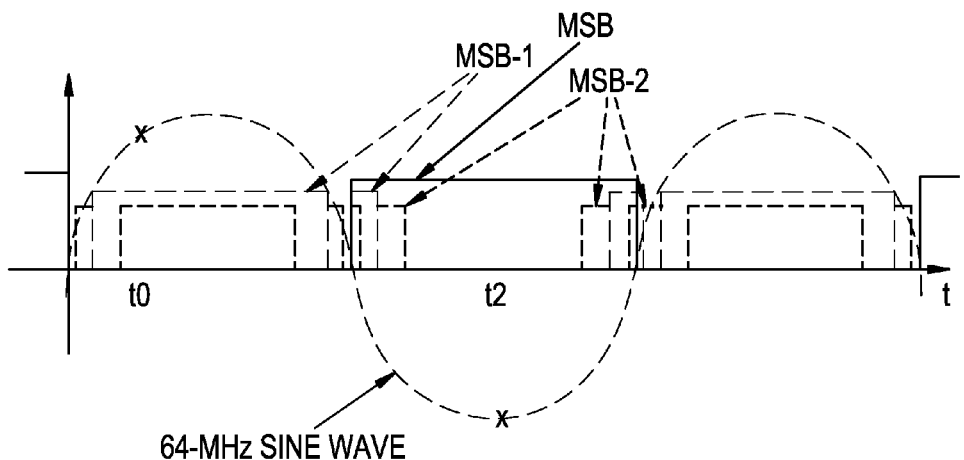
FIGS. 4(a)-4(d) are graphic representations showing values assumed by individual bits of a 64-MHz digital sine-wave signal.
Figure 4B:
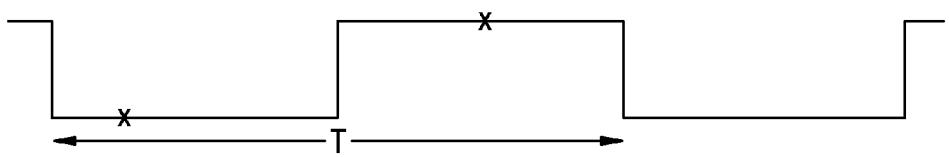
Figure 4C:
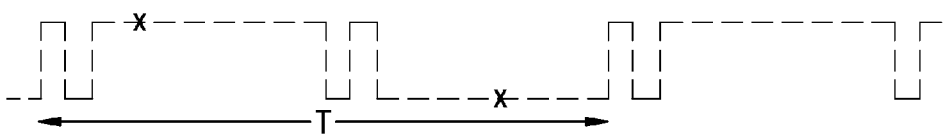
Figure 4D:
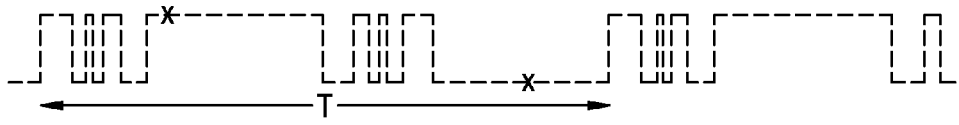

Accordingly, of output bits of the DDS 31, MSB, (MSB−1) bit, (MSB−2) bit are those obtained by sampling of the waveforms shown in FIGS. 4(b) through 4(d) at 200 MHz. Consequently, these bits include a 64-MHz frequency component. Other output bits of the DDS also include a 64-MHz frequency component changing in a period of T.

As described above, digital RF pulse signals are sent on the digital bus at 200 MHz, but each bit thereof includes a 64-MHz frequency component. For this reason, noise that is superimposed on analog magnetic resonance signals and cannot be removed by a filter because of the same frequency as the analog magnetic resonance signals is generated even in the digital bus through which digital RF pulse signals are sent to the D/A converter 40.

Figure 5:
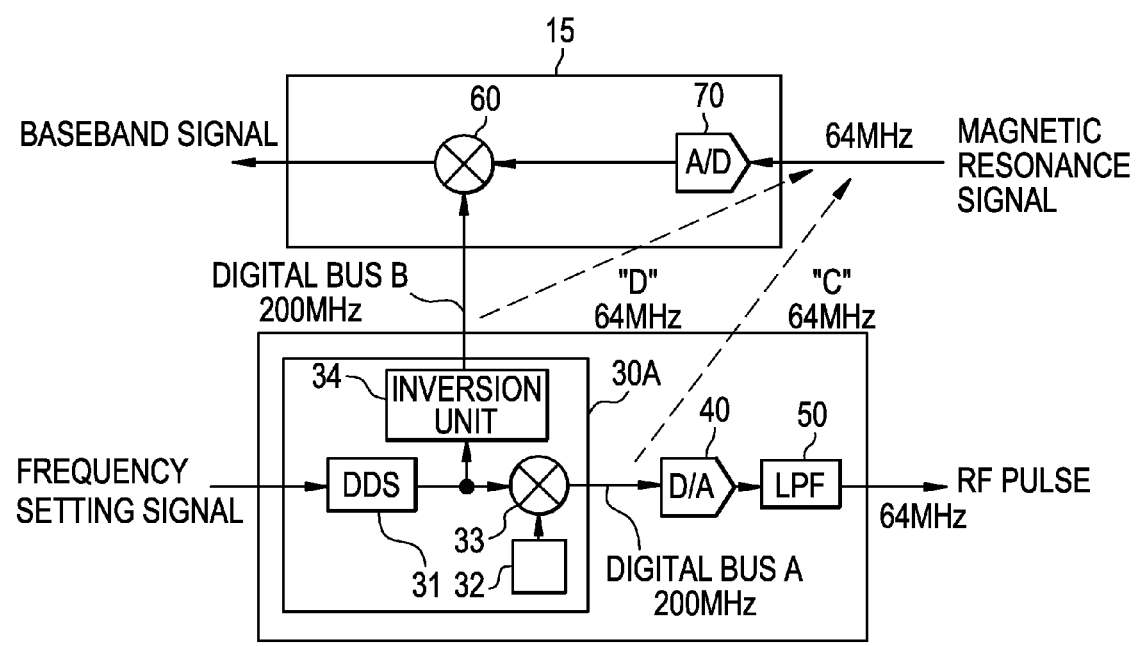
FIG. 5 is a block diagram showing an example of an RF pulse generating circuit and a magnetic resonance signal receiving circuit according to an embodiment of the invention.

FIG. 5 is a block diagram showing an example of an RF pulse generating circuit and a magnetic resonance signal receiving circuit according to an embodiment of the invention. The RF pulse generating circuit 14A comprises a frequency synthesizer for RF pulses 30A, a D/A converter 40, and an LPF 50 and the frequency synthesizer for RF pulses 30A includes a DDS 31, a digital envelope signal generator 32, a digital mixer 33, and an inversion unit 34. The magnetic resonance signal receiving circuit comprises a digital mixer 60 and an A/D converter 70. The same reference numbers in FIG. 1, FIG. 2 and FIG. 5 denote the same components.

The initial value of phase and the frequency of a digital carrier signal which is output by the DDS 31 are set by a frequency setting signal which is provided from the data processing unit 171 included in the operator console 17 via the control unit 16. The digital mixer 33 modulates a digital carrier signal which is output from the DDS 31 with a digital envelope signal which is output from the digital envelope signal generator 32 and thus generates digital RF pulse signals.

The digital RF pulse signals are sent to the D/A converter 40 through a digital bus A. The digital RF pulse signals sampled at 200 MHz flow through the digital bus A. The digital RF pulse signals have a predetermined bandwidth in accordance with a slice width when the RF pulses are transmitted, but the envelope signal remains constant when magnetic resonance signals are received. Consequently, when magnetic resonance signals are received, a 64-MHz sine-wave signal resulting from sampling the digital RF pulse signals at 200 MHz flows through the digital bus A. As described above, a 64-MHz noise is generated from each individual bit of this 64-MHz digital sine-wave signal. The 64-MHz digital sine-wave signal is converted into an analog signal by the D/A converter 40 and higher harmonic components thereof are removed by the LPF 50. When magnetic resonance signals are received, the 64-MHz analog sine-wave signal is stopped before being applied to the RF coil and it is not transmitted from the RF coil.

The inversion unit 34 generates a digital inverted carrier signal by transforming a digital carrier signal output from the DDS 31 into two's complement form. The digital inverted carrier signal is sent through a digital bus B to the magnetic resonance signal receiving circuit 15. When the digital inverted carrier signal flows through the digital bus B, a 64-MHz noise is also generated from each individual bit thereof.

On the other hand, the A/D converter 70 converts analog magnetic resonance signals received by the RF coil assembly 114 into digital magnetic resonance signals. The digital mixer 60 demodulates the digital magnetic resonance signals with the digital inverted carrier signal and converts them into baseband digital magnetic resonance signals with a center frequency of 0 Hz.

Figure 6A:
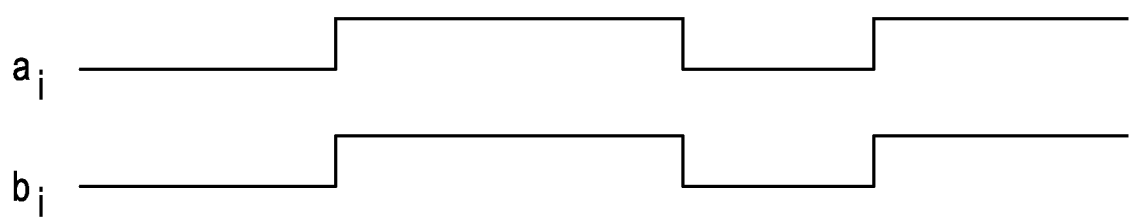
FIGS. 6(a) and 6(b) are diagrams illustrating a principle of noise removal.
Figure 6B:

FIGS. 6(a) and 6(b) are diagrams illustrating a principle of noise removal, wherein $a_i$ and $b_i$ denote the waveforms of each individual bit flowing through the digital bus A and the digital bus B, respectively. FIG. 6(a) relates to an example of sending a digital carrier signal on the digital bus B, while FIG. 6(b) relates to sending a digital inverted carrier signal on the digital bus B. In FIG. 6(a), both waveforms $a_i$ and $b_i$ make simultaneous level changes. Thus, noises arising from $a_i$ and $b_i$ are added and a large combined noise is produced. Consequently, sending the digital carrier signal on the digital bus B results in a large noise that is superimposed on analog magnetic resonance signals. On the other hand, in FIG. 6(b), the waveforms $a_i$ and $b_i$ make level changes in opposite directions. Therefore, the noises arising from $a_i$ and $b_i$ cancel each other in FIG. 6(b). However, the digital inverted carrier signal flowing through the digital bus B has a two's complement relationship with the digital carrier signal flowing through the digital bus A. Since some lower bits of the digital inverted carrier signal do not have an inversion relation with the corresponding bits of the digital carrier signal, the noises arising from all bits of the digital inverted carrier signal and all bits of the digital carrier signal do not cancel each other.

However, noise C (shown in FIG. 5) generated from the digital bus A is the sum of the noises arising from all bits of the signal flowing through the digital bus A and it is the noise of an analog signal changing at 64 MHz. Likewise, noise D (shown in FIG. 5) generated from the digital bus B is the sum of the noises arising from all bits of the signal flowing through the digital bus B and it is the noise of an analog signal changing at 64 MHz. A relation between noise C and noise D is characterized in that both noises cancel each other. Accordingly, sending the digital inverted carrier signal on the digital bus B enables reducing the noise that is superimposed on analog magnetic resonance signals.

Because, for the digital mixer 60, it is at least required that the frequency of a signal used for demodulation is equal to the center frequency of RF pulses, without regard to a phase difference relative to the center frequency of RF pulses, the digital inverted carrier signal may be used to demodulate digital magnetic resonance signals.

The RF pulse generating circuit 14A is an example of an RF pulse generating circuit involved in the invention, the DDS 31 is an example of a carrier generator involved in the invention, the digital mixer 33 is an example of a digital modulator involved in the invention, the D/A converter 40 is an example of a digital-analog converter involved in the invention, the inversion unit 34 is an example of an inversion unit involved in the invention, the magnetic resonance signal receiving circuit 15 is an example of a magnetic resonance signal receiving circuit involved in the invention, the A/D converter 70 is an example of an analog-digital converter involved in the invention, and the digital mixer 60 is an example of a digital demodulator involved in the invention.

Figure 7:
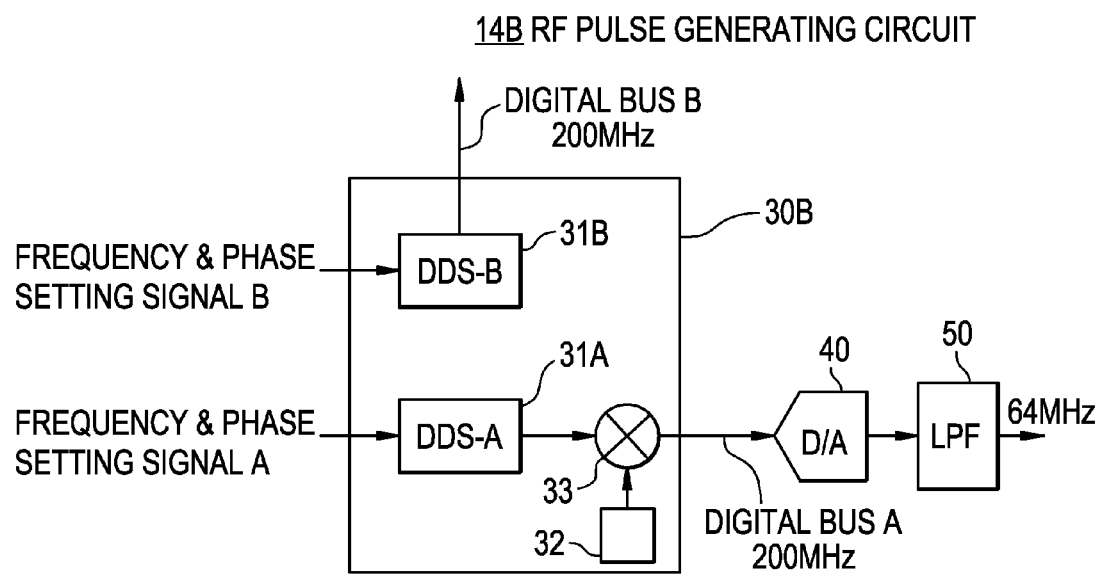
FIG. 7 is a block diagram showing an embodiment of an RF pulse generating circuit.

FIG. 7 is a block diagram showing an example of an RF pulse generating circuit according to another embodiment of the invention. The RF pulse generating circuit 14B comprises a frequency synthesizer for RF pulses 30B, a D/A converter 40, and an LPF 50. The frequency synthesizer for RF pulses 30B includes a DDS-A 31A, a DDS-B 31B, a digital envelope signal generator 32, and a digital mixer 33. The same reference numbers in FIG. 5 and FIG. 7 denote the same components. Unlike the RF pulse generating circuit 14A in which the inversion unit 34 generates a digital inverted carrier signal, the DDS-B 31B generates a digital inverted carried signal in the RF pulse generating circuit 14B.

The functions of the DDS-A 31A and the DDS-B 31B are the same as the DDS 31 in FIG. 5. Specifically, each of the DDS-A 31A and the DDS-B 31B includes a phase memory 311, a phase accumulator 312, and a waveform table 313. A phase increment is stored in the phase memory 311. The phase accumulator 312 stores an accumulated phase. An initial value of phase is set in the phase accumulator 312 at initialization and an accumulated phase is calculated by adding the phase increment for every clock period. The accumulated phase is input to the waveform table 313. The waveform table 313 is, for example, formed by a ROM and digital carrier signal values corresponding to accumulated phases are stored therein. An accumulated phase is input into an address of the ROM and a digital carrier signal value stored in that address is output from the ROM.

The frequency and the initial value of phase of a digital carrier signal which is output by the DDS-A 31A are set by a frequency and phase setting signal A and the frequency and the initial value of phase of a digital inverted carrier signal which is output by the DDS-B 31B are set by a frequency and phase setting signal B. Using the frequency and phase setting signal A and the frequency and phase setting signal B, the digital carrier signal and the digital inverted carrier signal can be adjusted to have an arbitrary phase difference between them. However, because of the aim to reduce the noise that is superimposed on magnetic resonance signals, the frequencies of the digital carrier signal and the digital inverted carrier signal are set equal to the center frequency of RF pulses.

There is a delay depending on each path which generates noise superimposed on magnetic resonance signals. Therefore, even when the digital inverted carrier signal having the two's complement relationship with the digital carrier signal is sent on the digital bus B, noise C generated from the digital bus A and noise D generated from the digital bus B do not always counteract each other. To minimize the noise that is superimposed on magnetic resonance signals, it is needed to adjust a phase difference between the digital carrier signal and the digital inverted carrier signal. Accordingly, in the present embodiment, the phase difference between the digital carrier signal and the digital inverted carrier signal is adjusted by using the DDS-A 31A and the DDS-B 31B.

The RF pulse generating circuit 14B is an example of an RF pulse generating circuit involved in the invention, the DD S-A 31A is an example of a carrier signal generator involved in the invention, and the DD S-B 31B is an example of an inversion unit involved in the invention.

Figure 8:
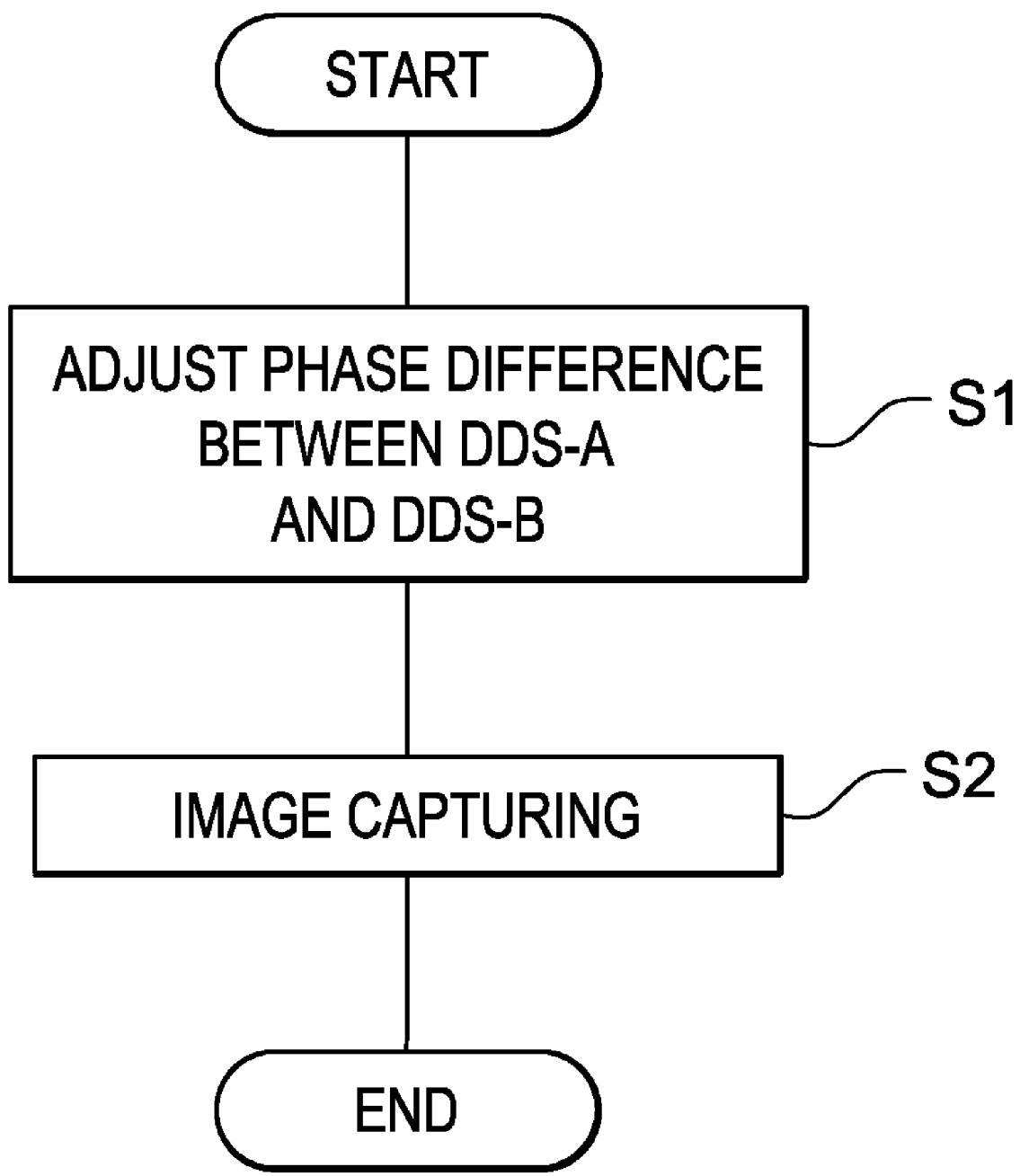
FIG. 8 is a flow diagram illustrating an exemplary method of adjusting a phase difference between a digital carrier signal and a digital inverted carrier signal.

FIG. 8 is a flow diagram illustrating an example of a method of adjusting the phase difference between the digital carrier signal and the digital inverted carrier signal. Before capturing an image of the subject 20, a phase difference between the DDS-A 31A and the DDS-B 31B is set, when the subject 20 does not exist in the bore 111 of the MRI apparatus 10 (step S1). That is, when the subject 20 is not laid on the cradle 12, to minimize the noise that is superimposed on magnetic resonance signals, the phase difference between the digital RF pulse signal flowing through the digital bus A and the digital inverted carrier signal flowing through the digital bus B is adjusted using the frequency and phase setting signal A and the frequency and phase setting signal B. After that, the cradle 12 on which the subject 20 has been laid is moved into the bore 111 by the transport mechanism and image capturing is performed, while the phase difference set in step SI is maintained (step S2). Because the phase difference between the DDS-A 31A and the DDS-B 31B remains unchanged for a certain time, imaging the subject 20 can be performed under minimum noise conditions, once the phase difference between the DD S-A 31A and the DDS-B 31B has been adjusted.

While the MRI apparatus with the static magnetic field intensity of 1.5 T has been discussed above by way of example, it is needless to say that the invention can be applied to MRI apparatus having other static magnetic field intensities such as 3 T.

As explained above, the invention can reduce noise that is superimposed on analog magnetic resonance signals from digital RF pulse signals before being converted into analog RF pulse signals by the D/A converter.

In most cases, the RF pulse generating circuit 14A and the RF pulse generating circuit 14B are generally manufactured in a programmable LSI such as FPGA. In that case, noise can be reduced without imposing additional cost for adding external circuits and making changes to wiring patterns on the substrate.

While embodiments of the invention have been described hereinbefore, it should be understood that various modifications and combinations required in view of convenience in design and other factors are involved in the scope of the invention defined by the invention described in the claims and its specific examples described in the embodiments of the invention.

Many widely different embodiments of the invention may be configured without departing from the spirit and the scope of the present invention. It should be understood that the present invention is not limited to the specific embodiments described in the specification, except as defined in the appended claims.,

The invention claimed is:

1. An MRI apparatus comprising:
   an RF coil to which analog RF pulse signals are applied;
   an RF pulse generating circuit configured to generate the analog RF pulse signals; and
   a magnetic resonance signal receiving circuit configured to receive analog magnetic resonance signals and to convert the analog magnetic resonance signals into baseband digital magnetic resonance signals,
   wherein said RF pulse generating circuit comprises:
      a carrier signal generator configured to generate a digital carrier signal having a predetermined number of bits;
      a digital modulator configured to modulate the digital carrier signal with a digital envelope signal to generate digital RF pulse signals;
      a digital-analog converter configured to generate the digital RF pulse signals into the analog RF pulse signals; and
      an inversion unit configured to generate a digital inverted carrier signal having a two's complement relationship with the digital carrier signal and to send the digital inverted carrier signal to said magnetic resonance signal receiving circuit, and wherein said magnetic resonance signal receiving circuit comprises:
an analog-digital converter configured to convert the analog magnetic resonance signals into digital magnetic resonance signals having a predetermined number of bits; and
a digital demodulator configured to demodulate the digital magnetic resonance signals with the digital inverted carrier signal to convert the digital magnetic resonance signals into the baseband digital magnetic resonance signals.

2. The MRI apparatus according to claim 1, wherein said carrier signal generator comprises:
a first phase memory configured to store a phase increment;
a first phase accumulator configured to set an initial value of a first phase at initialization and to calculate a first accumulated phase by adding the phase increment for every clock period; and
a first waveform table configured to store digital carrier signal and to output the digital carrier signal corresponding to the first accumulated phase when the first accumulated phase is input into said first waveform table.

3. The MRI apparatus according to claim 2, wherein said inversion unit is configured to generate the digital inverted carrier signal by transforming the digital carrier signal generated by said carrier signal generator into two's complement form.

4. The MRI apparatus according to claim 2,
wherein said inversion unit comprises:
a second phase memory configured to store the phase increment;
a second phase accumulator configured to set an initial value of a second phase at initialization and to calculate a second accumulated phase by adding phase increment for every clock period; and
a second waveform table configured to store the digital inverted carrier signal and to output the digital inverted carrier signal corresponding to second accumulated phase when the second accumulated phase is input into said second waveform table, wherein an arbitrary phase difference between the digital carrier signal and the digital inverted carrier signal may be set by adjusting the initial value of the first phase and the initial value of the second phase.

5. The MRI apparatus according to claim 3, wherein said digital modulator comprises a digital mixer.

6. The MRI apparatus according to claim 4, wherein said digital modulator comprises a digital mixer.

7. The MRI apparatus according to claim 5, wherein said digital demodulator comprises a digital mixer.

8. The MRI apparatus according to claim 6, wherein said digital demodulator comprises a digital mixer.

9. The MRI apparatus according to claim 7, further comprising a low-pass filter configured to remove higher harmonic components included in the analog RF pulse signals.

10. The MRI apparatus according to claim 8, further comprising a low-pass filter configured to remove higher harmonic components included in the analog RF pulse signals.

11. The MRI apparatus according to claim 9, wherein the analog RF pulse signals from which the higher harmonic components have been removed are amplified and applied to said RF coil.

12. The MRI apparatus according to claim 4, the initial value of the first phase and the initial value of the second phase are set to minimize noise that is superimposed on the analog magnetic resonance signals when a subject does not exist in a bore.

13. An RF pulse generating circuit for use in an MRI apparatus including a magnetic resonance signal receiving circuit configured to demodulate digital magnetic resonance signals having a predetermined number of bits with a digital inverted carrier signal to convert the digital magnetic resonance signals into baseband digital magnetic resonance signals, said RF pulse generating circuit comprising:
a carrier signal generator configured to generate a digital carrier signal having a predetermined number of bits;
a digital modulator configured to modulate the digital carrier signal with a digital envelope signal to generate digital RF pulse signals;
a digital-analog converter configured to convert the digital RF pulse signals into analog RF pulse signals; and
an inversion unit configured to generate a digital inverted carrier signal having a two's complement relationship with the digital carrier signal and to send the digital inverted carrier signal to said magnetic resonance signal receiving circuit.

14. The RF pulse generating circuit according to claim 13, wherein said carrier signal generator comprises:
a first phase memory configured to store a phase increment;
a first phase accumulator configured to set an initial value of a first phase at initialization and to calculate a first accumulated phase by adding the phase increment for every clock period; and
a first waveform table configured to store the digital carrier signal and to output the digital carrier signal corresponding to the first accumulated phase when the first accumulated phase is input into said first waveform table.

15. The RF pulse generating circuit according to claim 14, wherein said inversion unit is configured to generate the digital inverted carrier signal by transforming the digital carrier signal generated by said carrier signal generator into two's complement form.

16. The RF pulse generating circuit according to claim 14,
wherein said inversion unit comprises:
a second phase memory configured to store the phase increment;
a second phase accumulator configured to set an initial value of a second phase at initialization and to calculate a second accumulated phase by adding the phase increment for every clock period; and
a second waveform table configured to store the digital inverted carrier signal and to input the digital inverted carrier signal corresponding to the second accumulated phase when the second accumulated phase is input into said second waveform table, wherein an arbitrary phase difference between the digital carrier signal and the digital inverted carrier signal can be set by adjusting the initial value of the first phase and the initial value of the second phase.

17. The RF pulse generating circuit according to claim 15, wherein said digital modulator comprises a digital mixer.

18. The RF pulse generating circuit according to claim 16, wherein said digital modulator comprises a digital mixer.

19. The RF pulse generating circuit according to claim 17, wherein said digital demodulator comprises a digital mixer.

20. The RF pulse generating circuit according to claim 19, further comprising a low-pass filter configured to remove higher harmonic components included in the analog RF pulse signals.

* * * * *